US010665524B2

(12) United States Patent
Sikka et al.

(10) Patent No.: US 10,665,524 B2
(45) Date of Patent: May 26, 2020

(54) ELECTRONIC PACKAGE COVER HAVING UNDERSIDE RIB

(71) Applicant: International Business Machines Corporation, Armonk, NY (US)

(72) Inventors: Kamal K. Sikka, Poughkeepsie, NY (US); Krishna R. Tunga, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 15/671,734

(22) Filed: Aug. 8, 2017

(65) Prior Publication Data

US 2018/0082919 A1 Mar. 22, 2018

Related U.S. Application Data

(62) Division of application No. 15/271,980, filed on Sep. 21, 2016, now Pat. No. 9,837,333.

(51) Int. Cl.
| | |
|---|---|
| *H01L 23/367* | (2006.01) |
| *H01L 23/00* | (2006.01) |
| *H01L 21/48* | (2006.01) |
| *H01L 21/56* | (2006.01) |
| *H01L 23/373* | (2006.01) |
| *H01L 23/42* | (2006.01) |

(52) U.S. Cl.
CPC ........ *H01L 23/3675* (2013.01); *H01L 21/563* (2013.01); *H01L 24/16* (2013.01); *H01L 23/373* (2013.01); *H01L 23/3736* (2013.01); *H01L 23/42* (2013.01); *H01L 2224/16157* (2013.01)

(58) Field of Classification Search
CPC combination set(s) only.
See application file for complete search history.

(56) References Cited

U.S. PATENT DOCUMENTS

| | | |
|---|---|---|
| 5,096,081 A | 3/1992 | Shindo et al. |
| 6,724,080 B1 | 4/2004 | Ooi et al. |
| 6,775,140 B2 | 8/2004 | Shim et al. |
| 8,785,246 B2 | 7/2014 | Vu et al. |

(Continued)

OTHER PUBLICATIONS

Occhionero et al.,"Aluminum silicon carbide (AlSiC) microprocessor lids and heat sinks for integrated thermal management solutions", Proc. SPIE, pp. 055-059 (1999).

(Continued)

*Primary Examiner* — Moazzam Hossain
(74) *Attorney, Agent, or Firm* — ZIP Group PLLC (57) ABSTRACT

An electronic package lid which includes one or more underside ribs. The ribs have a major length and a minor width and are generally aligned to be parallel with a diagonal or normal bisector of the processing device. The underside rib generally stiffens the cover such that an upper surface of the cover is more apt to stay flat. As such, cover warpage and, therefore, the peeling of the TIM1 and delamination of underfill due to the physical or dimensional expansion of the processing device and/or a carrier may be reduced. As a result, the surface area dedicated for the seal material upon the carrier surface may be reduced, thereby increasing the available surface area upon the carrier for additional electronic components to be placed in close proximity to the processing device.

16 Claims, 6 Drawing Sheets

(56) References Cited

U.S. PATENT DOCUMENTS

| | | |
|---|---|---|
| 8,912,449 B2 | 12/2014 | Brown et al. |
| 9,286,565 B2 | 3/2016 | Arai et al. |
| 9,414,484 B2 | 8/2016 | Malatkar et al. |
| 2003/0164553 A1 | 9/2003 | Cheng et al. |
| 2004/0070069 A1 | 4/2004 | Subramanian |
| 2004/0150086 A1 | 8/2004 | Lee et al. |
| 2004/0178511 A1* | 9/2004 | Cheng ............... H01L 23/49513 257/783 |
| 2004/0238944 A1 | 12/2004 | Bish et al. |
| 2005/0250252 A1 | 11/2005 | Li |
| 2007/0217154 A1* | 9/2007 | Lai .................. H01L 23/427 361/700 |
| 2010/0109152 A1 | 5/2010 | Kariyazaki |
| 2010/0213261 A1* | 8/2010 | Caruana ............... G06K 19/025 235/486 |
| 2011/0215463 A1* | 9/2011 | Lin .................. H01L 23/32 257/727 |
| 2012/0018872 A1* | 1/2012 | Ahmad ............... H01L 23/3675 257/704 |
| 2012/0061852 A1* | 3/2012 | Su .................. H01L 21/563 257/777 |
| 2013/0196539 A1 | 8/2013 | Shafer et al. |
| 2014/0027897 A1* | 1/2014 | Han .................. B29C 65/08 257/701 |
| 2014/0131886 A1* | 5/2014 | Paek .................. H01L 24/11 257/774 |
| 2015/0155221 A1 | 6/2015 | Chen et al. |

OTHER PUBLICATIONS

Occhionero et al., "AlSiC and AlSiC hybrid composites . . . thermal management solutions", Proc. IEEE 6th Intl. Conf.on Electronic Packaging Technology, pp. 1-5 (2005).

CPS Technologies, "AlSiC Flip Chip and Microprocessor Lids", AlSiC Flip Chip Handout document downloaded from www.alsic.com.

Anonymous, "Method fora flip-chip package IHS with a stiffener", IPCOM000101595D Mar. 16, 2005.

List of IBM Patents or Patent Applications Treated as Related, dated herewith.

* cited by examiner

ELECTRONIC PACKAGE COVER HAVING UNDERSIDE RIB

FIELD OF THE EMBODIMENTS

Embodiments of the present invention generally relate to electronic devices or electronic packages and more specifically to a cover having an underside rib.

DESCRIPTION OF THE RELATED ART

An electronic package may include an integrated circuit (IC) chip, semiconductor die, processor, and the like, herein referred to as a processing device, packaged onto a carrier or substrate, herein referred to an carrier. The processing device may be encapsulated by a cover having high thermal conductivity. A thermal interface material (TIM1) may thermally connect the underside of the cover to the upper side of the processing device. A heat sink may be thermally connected to the cover via a thermal interface material (TIM2) to cool the processing device during operation of the electronic device where electrical energy is used by the processing device which results in the heating of the processing device. The heat sink generally removes heat from the processing device which results in the processing device to operate at a lower temperature. The electronic package may be within and utilized by a larger electronic system such as a computer, server, cash machine, kiosk, automobile infotainment system, or the like.

The heating of the electronic package results in the physical or dimensional expansion of the processing device and the carrier. Typically, the processing device and the carrier do not expand uniformly. The expansion differences are generally due to the carrier having a larger coefficient of thermal expansion (CTE) relative to the processing device.

Further, modern processing devices may require reduced signal latency and operate at increased speeds. These requirements may force an increased number of electronic components, such as a co-processor, microchip, decoupling capacitor, or applicable electronic components to be located in close proximity to the processing device. As such, an increased number of electronic components are being placed or otherwise located upon a similar laminate surface near the processing device which, in turn, reduces the available surface area upon the surface that is dedicated for a seal material that attaches the cover to the carrier.

The seal material generally couples the cover to the carrier and aids in the restriction of cover warpage and, therefore, the peeling of the TIM1 away from the underside of the cover or the upper side of the processing device and the delamination of underfill from in between the processing device and the carrier which may occur as a result of the physical or dimensional expansion of the processing device and/or the carrier due to the heating of the electronic package. As such, as the surface area of the carrier which is dedicated for the seal band is reduced there is an increased risk for cover warpage.

SUMMARY

In an embodiment of the present invention, an electronic package is presented. The electronic package includes a processing device, a carrier, a seal band upon the carrier, and a cover. The processing device is electrically connected to the carrier and includes a diagonal bisector that travels through a center of the processing device and at least one corner of the processing device. The cover includes a perimeter bottom surface connected to the carrier via the seal band. The cover also includes an underside rib that has a major length and minor width. The underside rib is positioned upon the cover so that the major length is parallel with the diagonal bisector and an inner end surface of the underside rib contacts a corner of the processing device. The perimeter bottom surface of the cover and an underside rib surface are coplanar and the inner end surface is orthogonal to the underside rib surface.

In another embodiment of the present invention, an electronic device is presented. The electronic device includes a memory that is communicatively connected to a processing device, a carrier, a seal band upon the carrier, and a cover. The processing device is electrically connected to the carrier and includes a diagonal bisector that travels through a center of the processing device and at least one corner of the processing device. The cover includes a perimeter bottom surface connected to the carrier via the seal band. The cover also includes an underside rib that has a major length and minor width. The underside rib is positioned upon the cover so that the major length is parallel with the diagonal bisector and an inner end surface of the underside rib contacts a corner of the processing device. The perimeter bottom surface of the cover and an underside rib surface are coplanar and the inner end surface is orthogonal to the underside rib surface.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 3B-FIG. 6 depict a normal view of the underside of an electronic package, with the carrier removed for convenience, according to one or more embodiments of the present invention.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Embodiments of the present invention are related to an electronic package lid which includes one or more underside ribs. The ribs have a major length and a minor width and are generally aligned to be parallel with a diagonal or normal bisector of the processing device. The underside rib generally stiffens the cover such that an upper surface of the cover is more apt to stay flat. As such, cover warpage and, therefore, the peeling of the TIM1 and delamination of underfill due to the physical or dimensional expansion of the processing device and/or the carrier may be reduced. As a result, the surface area dedicated for the seal material upon the carrier surface may be reduced, thereby increasing the available surface area upon the carrier for additional electronic components to be placed in close proximity to the processing device.

Figure 1:
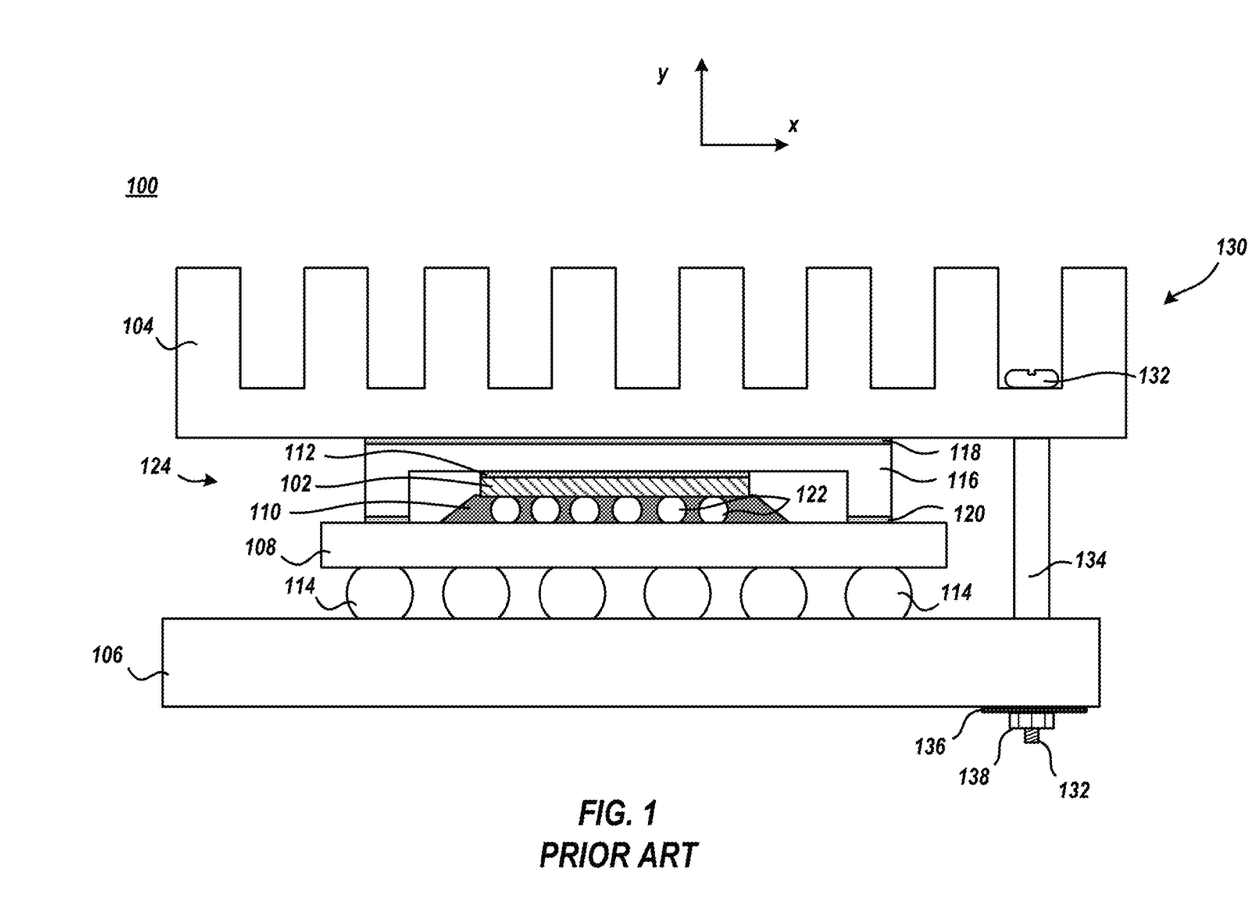
FIG. 1 depicts a prior art system including an electronic package, motherboard, and heat sink.

FIG. 1 depicts a prior art electronic device system 100 that includes electronic package 124 which is cooled by a heat sink 104 and is connected to motherboard 106. Electronic system 100 may be included within a larger electronic data handling system such as, for example, a computer, server, kiosk, automobile infotainment system, and the like. Electronic package 124 includes processing device 102, carrier 108, interconnects 122, TIM1 112, cover 116, and seal band 120. Processing device 102 may be an integrated circuit, semiconductor die, processor, microchip, and the like. Carrier 108 may be a substrate, an organic carrier, a ceramic carrier, or the like, and provides mechanical support for processing device 102 and electrical paths from the upper surface of carrier 108 to the opposing side of carrier 108. Interconnects 122 electrically connect processing device 102 and the upper side of carrier 108 and may be a wire bond, solder bond, stud, conductive ball, conductive button, and the like. Underfill 110 may be included within electronic package 124 and is electrically-insulating, may substantially surround interconnects 122, may electrically isolate individual interconnects 122, and may provide mechanical support between processing device 102 and carrier 108. Underfill 110 may aid to prevent damage to individual interconnects 122 due to thermal expansion mismatches between processing device 102 and carrier 108.

In certain embodiments, when processing device 102 is aligned against carrier 108, a reflow process may be performed to join interconnects 122 to electrical contacts of both processing device 102 and carrier 108 thereby seating the processing device 102 to carrier 108. After processing device 102 is attached or otherwise electrically connected to carrier 108, a cover 116 may be attached to carrier 108 with seal band 120 to cover, encapsulate, or the like, processing device 102. Generally, during operation of processing device 102, heat needs to be removed from processing device 102. In this situation, cover 116 is both a cover and a conduit for heat transfer. As such, TIM 1 112 may thermally connect the underside surface of cover 116 and the upper surface processing device 102.

Electronic package 124 may be connected to a motherboard 106 via interconnects 114. Motherboard 106 may be the main printed circuit board of electronic device 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When electronic package 124 is aligned upon motherboard 106 a second reflow process may be performed to join interconnects 114 to electrical contacts of both carrier 108 and motherboard 106.

To assist in the removal of heat from processing device 102 a heat sink 104 may be thermally connected to electronic package 124 via TIM2 118. Heat sink 104 may be a passive heat exchanger that cools processing device 102 by dissipating heat into the surrounding air. Heat sink 104 may also be an active heat exchanger wherein a fluid is actively forced across or through heat sink 104. During operation of electronic device 100, a thermal path exists from processing device 102 to heat sink 104 through TIM1 112, cover 116, TIM2 118, and the like. Heat sink 104 may include a base and fins. The lower surface of the base may be thermally connected to cover 116 via TIM2 118. Fins are connected to the upper side of base and are generally spaced apart so as to allow fluid to exist, or flow, between each fin.

Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon electronic package 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heat sink 104 upon electronic package 124.

The term thermally connected when utilized in association with elements being thermally connected shall herein mean that the elements transfer heat there between by at least indirect or direct conduction (e.g. the processing device directly contacts the cover, a conduction path exists between the processing device and the cover via TIM1, or the like). The term electrically connected when utilized in association with elements being electrically connected, shall herein mean that current is able to be intentionally passed from one element to another element (e.g., current flows from a conductor in one element to a conductor in the other element).

Figure 2:
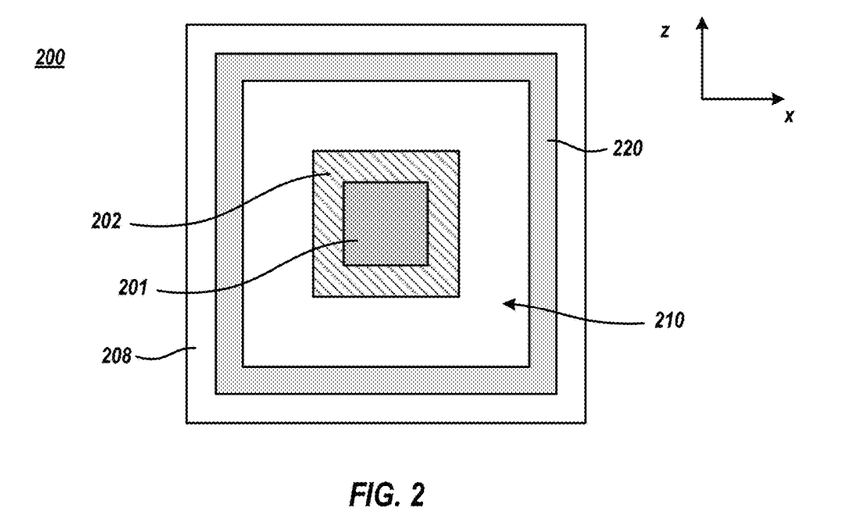
FIG. 2 depicts a normal view of an electronic package with the cover removed, according to one or more embodiments of the present invention.

FIG. 2 depicts a normal view of an electronic package 200 with a cover 300 removed, according to one or more embodiments of the present invention. Electronic package 200 includes processing device 202 and carrier 208 that are electrically connected by contacts (e.g. contacts 122). Electronic package 200 also includes a cover 300 (not shown in FIG. 2) connected to carrier 108 via seal band 220. Cover 300 is also thermally connected to processing device 202 via TIM1 201. Though TIM1 201 is shown as having a smaller surface area than processing device 202, TIM1 201 may have the same surface area as the processing device 202. Electronic package 200 may also include underfill 110 (not shown in FIG. 2) between the processing device 202 and the carrier 208.

Processing device 202 may be the same device as processing device 102, carrier 208 may be the same device as carrier 108, TIM1 201 may be similar to TIM1 112, seal band 220 may be similar to seal band 120, and may, for example, be utilized in place thereof within system 100, or the like. Similarly, electronic package 200 may be utilized in place of electronic package 124 within system 100.

The normal view shape of carrier 208 and processor 202 are depicted as square shaped in FIG. 2. However, the normal view shape of carrier 208 and processor 202 may generally be any shape, such as a polygonal shape. The normal view of the element referred to in this paragraph may represent the top view, bottom view, or generally the xz planar view of that element. The normal view shape of the carrier 208 may be similar to the normal view shape of processor 202. The seal band 220 is generally applied to the surface 210 of carrier 208 distally away from the perimeter or side surfaces of the processing device 202. As such there is a surface area upon surface 210 of carrier 208 between the processing device 202 and the seal band 220 that may be used to place electronic components, such as surface mount components, microprocessors, co-processors, decoupling capacitors, or the like in close proximity to processing device 202. The normal view shape of seal band 220 upon the carrier 208 may be the same or similar to the normal view shape of processing device 202.

Various seal band 220 materials are known in the art. For example, the seal band 220 may be an adhesive, epoxy, or the like. Various seal band 220 materials may need to be cured to set the adhesive properties of the material. With such seal band 220 materials, the cover 300 is attached to the carrier 208 by positioning the cover 300 against the seal band 220 and curing the seal band 220 material. The seal band 220 is generally applied upon the surface 210 of carrier 208 in such locations that allow for portions the cover 300 to both be positioned against the seal band 220 material and be thermally connected to processing device 202 via TIM1 201.

Figure 3A:
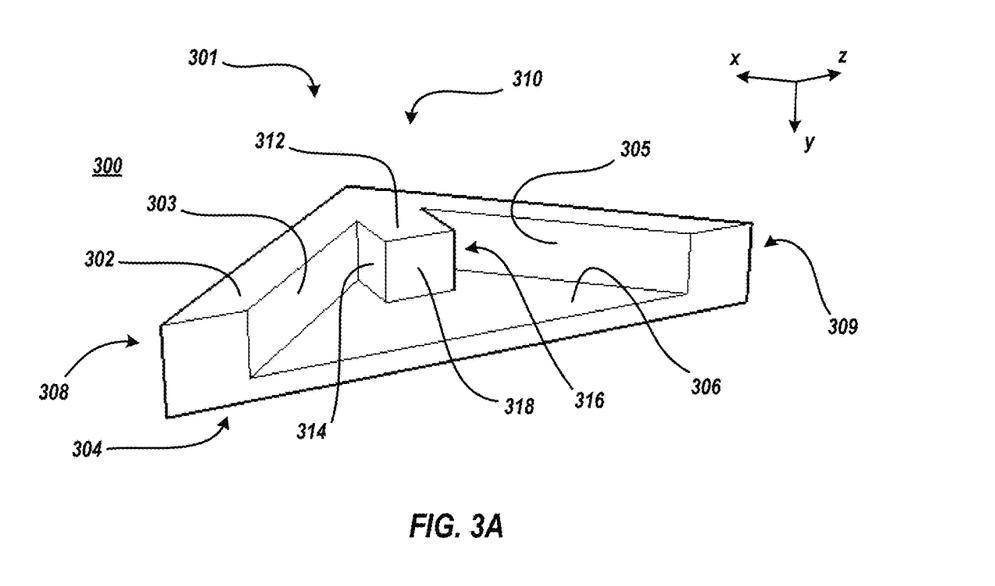
FIG. 3A depicts an isometric section view of the underside of an electronic package cover which includes an underside rib, according to one or more embodiments of the present invention.

FIG. 3A depicts an isometric section view of the underside of electronic package cover 300 which includes an underside rib 310, according to one or more embodiments of the present invention. Cover 300 includes a bottom surface 302, a top surface 304, and side surfaces (e.g., side surface 308, side surface 309). Cover also includes an underside recess 301 extending from the bottom surface 302 toward top surface 304. The shape of underside recess 301 is generally the same as the perimeter surface of cover 300 formed by the side surfaces. The surface area of underside recess 301 is generally less than the surface area of top surface 304, and thus, cover 300 includes bottom surface 302 and underside sidewalls (e.g. surface 303, surface 305). The depth of underside recess 301 extending from bottom surface 302 is generally less than the distance between bottom surface 302 and top surface 304, and thus, cover 300 includes underside surface 306. The distance between underside surface 306 and top surface 304 may be sufficient to allow that top surface 304 to maintain planarity or flatness during cover 300 loading or installation to the carrier 208.

Rib 310 has a major length and minor width and is generally located within cover 300 so that the rib 310 is aligned with a bisector of processing device 202. The rib 310 includes a rib surface 312, side surface 314, side surface 316, inner end surface 318, and outer end surface 320 (not shown in FIG. 3A). The major length is defined by side surfaces 314 and 316 and the minor width is defined by inner surface 318. The major length is generally greater than the minor width.

In one embodiment, as is exemplary shown in FIG. 3A, side surface 314 is parallel with side surface 316. In another embodiment, as is exemplary shown in FIG. 4, surface 314 and surface 316 are angled against one another. Similarly, inner end surface 318 may be parallel with outer end surface 320. In embodiments, where side surface 314 is parallel with side surface 316, inner end surface 318 and/or outer end surface 320 may be orthogonal to side surface 314 and/or side surface 316.

The rib 310 generally extends from underside surface 306 toward bottom surface 302. In an implementation, rib surface 312 may be coplanar with bottom surface 302. Alternatively, rib surface 312 may be located offset from bottom surface 302 toward to positive "y" direction. In some embodiments, where rib surface 312 is coplanar with bottom surface 302, the rib surface 312 may be both integral and coplanar with bottom surface 302. The term "integral and coplanar" utilized herein shall mean that there is no delineation, border, and boundary separating the indicated surfaces.

Rib 310 may be located nearest a corner of cover 300. For example, rib 310 may be positioned nearest the vertex or intersection of surface 308 and surface 309. Or in other words, rib 310 may be located adjacent or touching the vertex or intersection of surface 303 and surface 305. Alternatively, rib 310 may be located upon an edge of cover 300. The term "edge" utilized herein shall mean a surface between two vertices. For example, rib 310 may be located adjacent or touching solely surface 303 or solely surface 305. In this example, side surface 314 and side surface 316 may be orthogonal to surface 303, 305, respectively, and inner end surface 318 and outer end surface 320 may be parallel to surface 303, 305, respectively. When rib is attached to surface 303 and/or surface 305, outer end surface 320 is generally coincident with surface 303 and/or surface 305.

In embodiments, bottom surface 302 is the sole surface of the cover 300 that contacts seal band 220, or carrier 208, if seal band 220 is not utilized. In other embodiments, bottom surface 302 and rib surface 312 are the surfaces of the cover 300 that contacts seal band 220, or carrier 208, if seal band 220 is not utilized. In embodiments, underside surface 306 is the sole surface of cover 300 that is thermally connected with processing device 202. When TIM1 201 is utilized, underside surface 306 may be the sole surface of cover 300 that is thermally connected with processing device 202 via TIM1 201.

Rib 300 generally stiffens the underside surface 306 and top surface 304 of cover 300 and also increases the coupling between the cover and the carrier and, thereby, limits or otherwise reduces such surfaces from deformation, warpage, or the like. The addition of a rib 300 into cover 300 allows the surface area of surface 302 to be reduced, relative to the necessary surface area of such a surface of a cover with no rib 300 to maintain the stiffness properties of the underside surface 306 and top surface 304. As such, there is a greater surface area of surface 210 between processing device 202 and surfaces 303, 305 to allow for an increased number of electronic components to be positioned within.

Cover 300 may formed from a metal material, such as copper, aluminum, or other metals having similar stiffness and heat transfer properties. Cover 300 may also be formed from a graphite or other material having similar stiffness and heat transfer properties.

Figure 3B:
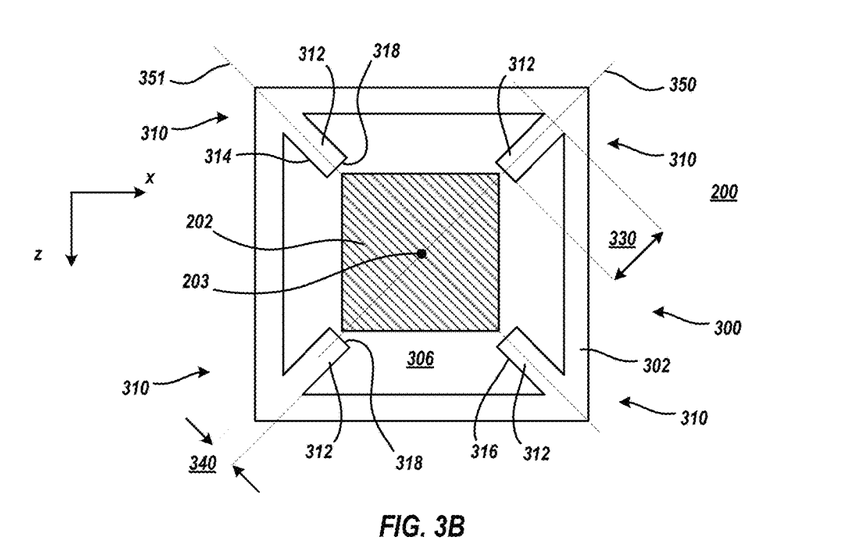
FIG. 3B depicts a normal view of the underside of an electronic package, with the carrier removed for convenience, according to one or more embodiments of the present invention.

FIG. 3B depicts a normal view of the underside surface 306 of an electronic package 200. For clarity, the electronic package 200 depicted in FIG. 3B may include carrier 208, seal band 220, etc. but such features are not shown in the present Figure to allow other features of to be depicted. As exemplary shown in FIG. 3B, processing device 202 may include a center 203, diagonal bisector 350, and diagonal bisector 351. Center 203 a point that is related to the normal view shape of processing device 202 in such a way that for any point on the normal view shape there is another point on the normal view shape such that a straight line joining the two points is bisected by center 203 point. In other words center 203 is the center of symmetry of the normal view shape of processing device 202. Diagonal bisector 350 is a bisecting line of the normal view shape of processing device that connects center 203 and a vertex of sidewall surfaces (i.e. the corner) of the processing device 202. Likewise, diagonal bisector 351 is a bisecting line of the normal view shape of processing device that connects center 203 and another corner of the processing device 202. In the example depicted, the diagonal bisector 350 connects two corners and the center 203 of processing device 202 and the diagonal bisector 351 connects two different corners and the center 203 of processing device 202. In some embodiments, the diagonal bisector 350 is orthogonal to diagonal bisector 351 in the xz plane.

In an embodiment, the rib 310 may be positioned within cover 300 to be parallel or substantially parallel with diagonal bisector 350 or 351. For example, an orthogonal or "y" axis bisector of surface 312 is parallel with diagonal bisector 350 or 351. The term "substantially parallel" shall mean a reference line is plus or minus fifteen degrees from another reference line. Therefore, in some implementations the orthogonal bisector of surface 312 may be plus or minus fifteen degrees from diagonal bisector 350 or 351.

Rib 310 has a major length 330 and minor width 340. Major length 330 is greater than minor width 340. The rib 310 may be positioned within cover 300 generally so that the major length 330 is parallel or substantially parallel with diagonal bisector 350 or 351.

In the example depicted in FIG. 3B, the major length 330 of rib 310 is a length such that inner end surface 318 does not contact processing device 202 and/or underfill 110 that exists between processing device 202 and carrier 208.

Figure 4:
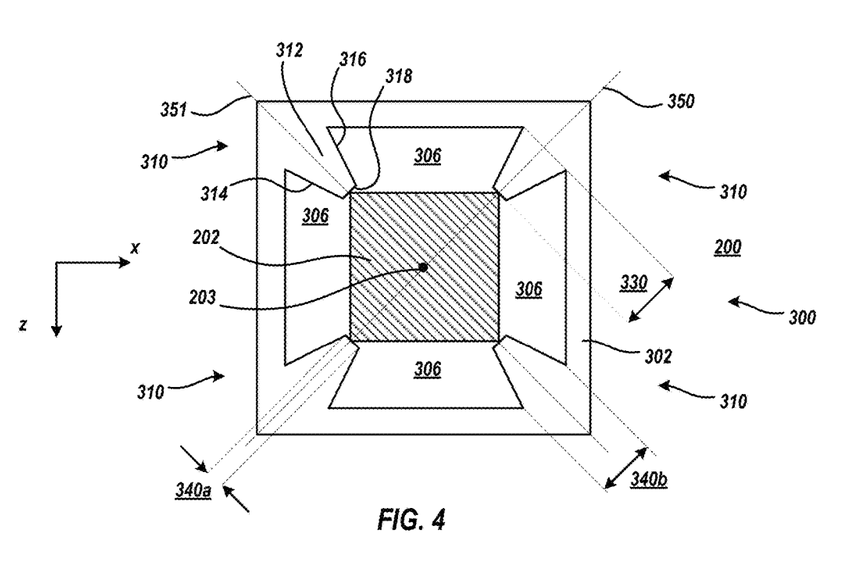

FIG. 4 depicts a normal view of the underside surface 306 of an electronic package 200. For clarity, the electronic package 200 depicted in FIG. 4 may include carrier 208, seal band 220, etc. but such features are not shown in the present Figure to allow other features of to be depicted. As exemplary shown in FIG. 4, processing device 202 may include a center 203, diagonal bisector 350, and diagonal bisector 351.

In an embodiment, the rib 310 surface 314 and surface 314 are angled with respect to one another. In the example shown the surface 314 and surface 314 are positioned such that there is still an orthogonal or "y" axis bisector of surface 312. As such, the rib 310 may still be positioned such that the orthogonal or "y" axis bisector of surface 312 is parallel or substantially parallel with diagonal bisector 350 or 351.

In embodiments, where surface 314 and surface 314 are angled with respect to one another, rib 310 has a major length 330 and first minor width 340a and a second minor width 340b. Major length 330 is greater than minor width 340a and minor width 340b. The rib 310 may be positioned within cover 300 generally so that the major length 330 is parallel or substantially parallel with diagonal bisector 350 or 351.

In the example depicted in FIG. 4, the major length 330 of rib 310 is a length such that inner end surface 318 does contact processing device 202 and/or underfill 110 that exists between processing device 202 and carrier 208. For example, inner end surface 318 contacts the corner of processing device 202.

Figure 5:
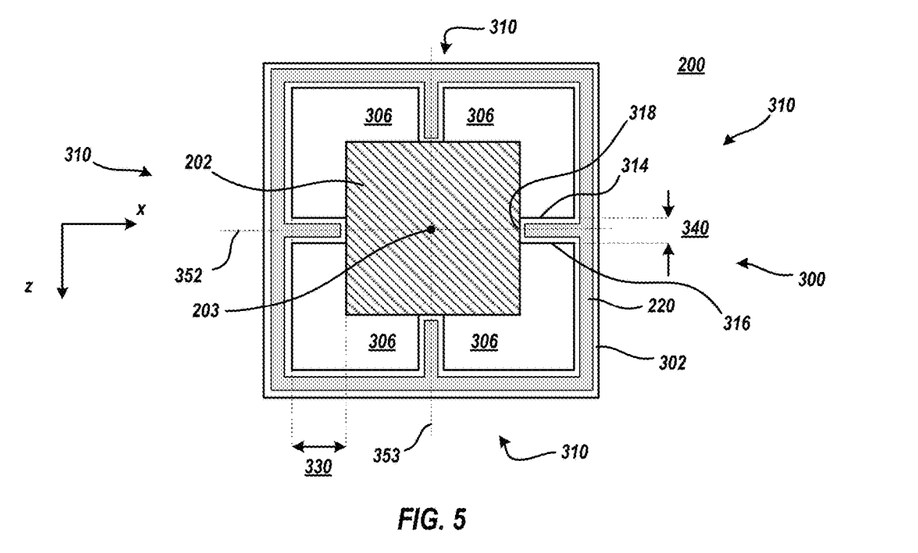

FIG. 5 depicts a normal view of the underside surface 306 of an electronic package 200. For clarity, the electronic package 200 depicted in FIG. 5 may include carrier 208, underfill 110, etc. but such features are not shown in the present Figure to allow other features of to be depicted. As exemplary shown in FIG. 5, processing device 202 may include a center 203, normal bisector 352, and normal bisector 353.

Normal bisector 352 is a bisecting line of the normal view shape of processing device that connects center 203 and an edge of a sidewall surface (i.e. a surface between corners) of the processing device 202. Likewise, normal bisector 352 is a bisecting line of the normal view shape of processing device that connects center 203 and another edge of the processing device 202. In the example depicted, the normal bisector 352 connects the midpoints of respective sidewall surfaces and the center 203 of processing device 202 and the normal bisector 353 connects other midpoints of respective sidewall surfaces and the center 203 of processing device 202. In some embodiments, the normal bisector 352 is orthogonal to normal bisector 353 in the xz plane.

In an embodiment, the rib 310 may be positioned within cover 300 to be parallel or substantially parallel with normal bisector 352 or 353. Therefore, in some implementations the orthogonal bisector of surface 312 may be plus or minus fifteen degrees from normal bisector 352 or 353.

Rib 310 has a major length 330 and minor width 340. Major length 330 is greater than minor width 340. The rib 310 may be positioned within cover 300 generally so that the major length 330 is parallel or substantially parallel with normal bisector 352 or 353.

In the example depicted in FIG. 5, the major length 330 of rib 310 is a length such that inner end surface 318 does contact processing device 202 and/or underfill 110 that exists between processing device 202 and carrier 208. For example, inner end surface 318 contacts the edge, or sidewall surface, of processing device 202. For clarity, other embodiments described herein alternatively include the rib 310 having inner end surface 318 that does not contact the edge or sidewall surface of the processing device 202.

Further, in the example depicted in FIG. 5, seal band 220 material may be dispensed or otherwise applied upon the surface 210 of carrier 208 in a pattern to correspond to the pattern of bottom surface 302 and rib surface 312 such that the seal band 220 is between bottom surface 302 and/or rib surface 312 and surface 210 of carrier 208. In other examples, seal band 220 material may be dispensed or otherwise applied upon the surface 210 of carrier 208 in a pattern to correspond to the pattern of solely bottom surface 302 such that the seal band 220 is solely between bottom surface 302 and surface 210 of carrier 208.

Figure 6:
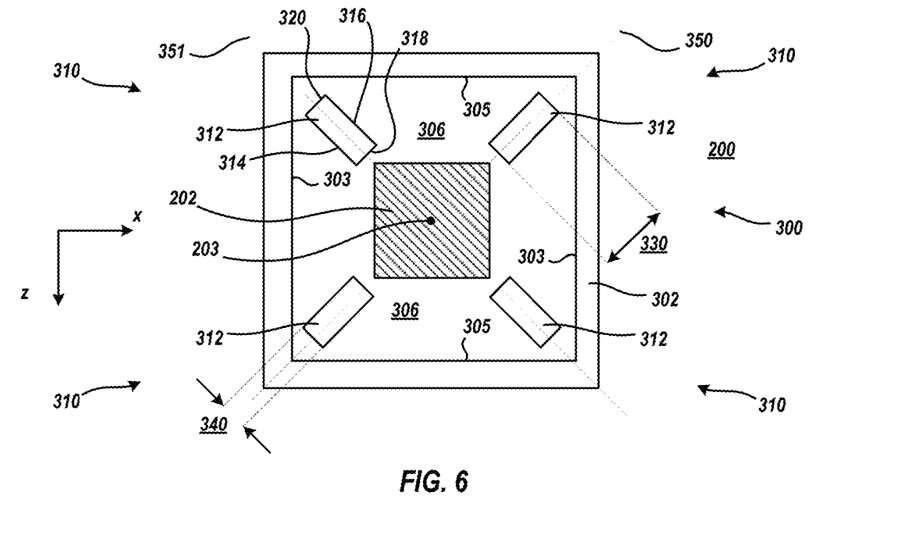

FIG. 6 depicts a normal view of the underside surface 306 of an electronic package 200. For clarity, the electronic package 200 depicted in FIG. 6 may include carrier 208, seal band 220, etc. but such features are not shown in the present Figure to allow other features of to be depicted. As exemplary shown in FIG. 6, processing device 202 may include a center 203, diagonal bisector 350, and diagonal bisector 351.

In an embodiment, the rib 310 may be positioned within cover 300 to be parallel or substantially parallel with diagonal bisector 350 or 351 such that surface 320 does not contact and is positioned distally away from surface 303 and/or surface 305 (i.e. surface 320 is not coincident with surface 303 and/or surface 305. For example, an orthogonal or "y" axis bisector of surface 312 is parallel or substantially parallel with diagonal bisector 350 or 351.

Rib 310 has a major length 330 and minor width 340. Major length 330 is greater than minor width 340. The rib 310 may be positioned within cover 300 generally so that the major length 330 is parallel or substantially parallel with diagonal bisector 350 or 351.

In the example depicted in FIG. 6, the major length 330 of rib 310 is a length such that inner end surface 318 does not contact processing device 202 and/or underfill 110 that exists between processing device 202 and carrier 208.

In another example, similar to that shown in FIG. 5, the cover 300 may include a center 203, normal bisector 352, and normal bisector 353 as opposed to diagonal bisector 350 or 351. In such embodiment, the rib 310 may be positioned within cover 300 to be parallel or substantially parallel with normal bisector 352 or 353. Therefore, in some implementations the orthogonal bisector of surface 312 may be plus or minus fifteen degrees from normal bisector 352 or 353 Likewise, the rib 310 may be positioned within cover 300 generally so that the major length 330 is parallel or substantially parallel with normal bisector 352 or 353.

The major length 330 of rib 310 may be a length such that inner end surface 318 does contact processing device 202 and/or underfill 110 that exists between processing device 202 and carrier 208. For example, inner end surface 318 contacts the edge or corner of processing device 202.

Figure 7:
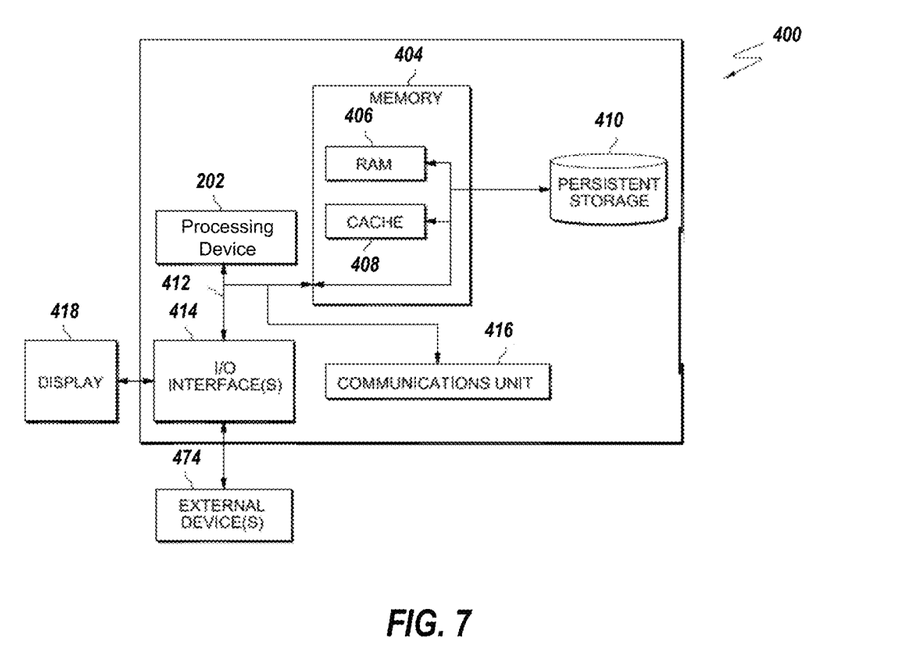
FIG. 7 depicts a block diagram of an electronic device that may utilized one or more embodiments of the present invention.

FIG. 7 depicts a block diagram of an electronic device 400 that may utilize various embodiments of the present invention. It should be appreciated that FIG. 7 provides only an illustration of one implementation of electronic device 400 that utilizes a processing device 202 and a cover 300 thermally connected thereto the operation of which causes heat to flow from processing device 202 to cover 300.

Electronic device 400 includes communications bus 412, which provides communications between processing device 202, memory 404, persistent storage 410, communications unit 416, and input/output I/O interface(s) 414. Processing device 202 may call program instructions stored in memory 404 as is known in the art. Memory 404 may be, for example, one or more random access memories (RAM) 406, cache memory 408, or any other suitable non-volatile or volatile storage device. Persistent storage 410 can include one or more of flash memory, magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 410 may also be removable. For example, a removable hard drive may be used for persistent storage 410. Other examples include an optical or magnetic disk that is inserted into a drive for transfer onto another storage device that is also a part of persistent storage 410, or other removable storage devices such as a thumb drive or smart card.

Communications unit 416 provides for communications with other electronic devices. Communications unit 416 includes one or more network interfaces. Communications unit 416 may provide communications through the use of either or both physical and wireless communications links. In other embodiments, electronic device 400 may be devoid of communications unit 416. Software may be downloaded to persistent storage 410 through communications unit 416.

I/O interface(s) 414 allows for input and output of data with other devices that may be connected to electronic device 400. I/O interface 414 may further provide a connection to other external devices such as a camera, mouse, keyboard, keypad, touch screen, and/or some other suitable input device. I/O interface(s) 414 may also connect to display 418.

Display 418 provides a mechanism to display data to a user and may be, for example, a computer monitor. Alternatively, display 418 may be integral to electronic device 400 and may also function as a touch screen.

Figure 8:
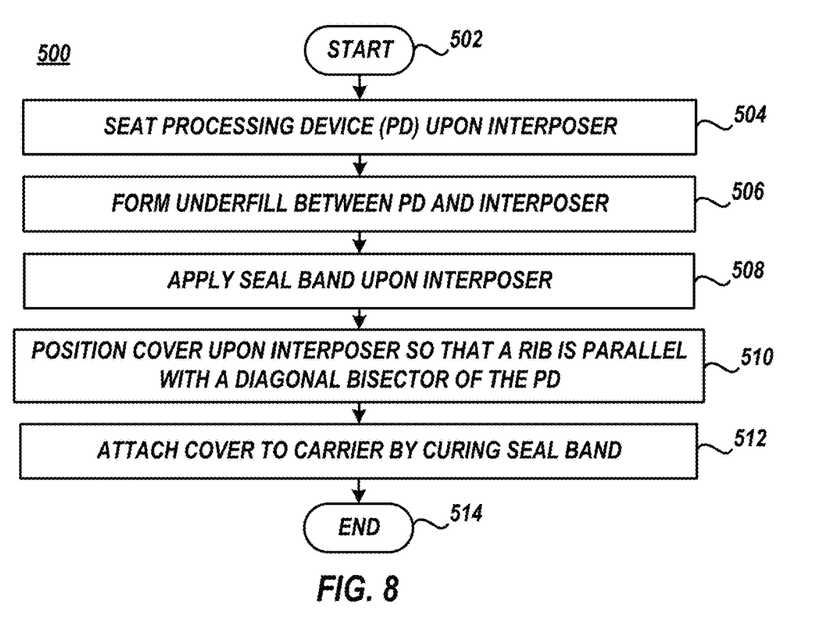
FIG. 8 and FIG. 9 depict a method of fabricating an electronic package, according to embodiments of the present invention.

FIG. 8 depicts a method 500 of fabricating an electronic package 200, according to embodiments of the present invention. Method 500 may begin at block 502 and continue with seating the processing device 202 upon the carrier 208 (block 504). For example, if processing device 202 is a pin in socket type processing device the processing device is forced into a socket upon the carrier such that the pins contact individual sockets with adequate swipe to be electrically connected. If processing device 202 is flip chip type processing device the processing device placed upon a grid array of conductive pads and contacts such that conductive pads of the processing device are aligned with the conductive pads of the carrier and are aligned with the grid array of contacts. The contacts are reflowed and the conductive pads of the carrier are electrically connected with the conductive pads of the processing device.

In certain embodiments, method 500 may continue with applying underfill 110 material between the processing device 202 and carrier 208 (block 506). For example, when processing device 202 is a flip-chip type processing device 202, underfill 110 material may be dispensed upon surface 210 of carrier 208 about the perimeter of processing device 202 such that capillary action draws the underfill 110 material underneath the processing device 202. In some implementations, the underfill 110 material is subsequently cured.

Method 500 may continue with applying seal band 220 material upon surface 210 of carrier 208 (block 508). For example, seal band 220 material may be dispensed or otherwise applied upon the surface 210 of carrier 208 in a pattern to correspond to the pattern of bottom surface 302 and rib surface 312 such that the seal band 220 is positioned to be between bottom surface 302 and/or rib surface 312 and surface 210 of carrier 208. In another example, seal band 220 material may be dispensed or otherwise applied upon the surface 210 of carrier 208 in a pattern to correspond to the pattern of solely bottom surface 302 such that the seal band 220 is positioned to be solely between bottom surface 302 and surface 210 of carrier 208.

Method 500 may continue with positioning cover 300 upon carrier 208 so that one or more lid ribs 310 are at least substantially parallel with a diagonal bisector 350, 351 of the processing device 202 (block 510). For example, the major length 330 of the one or more ribs 310 may be substantially parallel or parallel with diagonal bisector 350 or diagonal bisector 351. Similarly, the "y" axis bisector of rib surface 312 may be substantially parallel or parallel with diagonal bisector 350 or diagonal bisector 351. The position of cover 300 upon carrier 208 so that one or more lid ribs 310 are at least substantially parallel with a diagonal bisector 350, 351 of the processing device 202 may also result in the cover 300 being positioned upon seal band 220 material such that the seal band 220 is positioned between bottom surface 302 and/or rib surface 312 and surface 210 of carrier 208. In some embodiments, the cover 300 is further positioned upon the carrier 208 such that inner end surface 318 does or, alternatively, does not touch or contact processing device 202 or underfill 110.

Method 500 may continue with curing the seal band 220 material to securely attach the cover 300 to carrier 208 (block 512). For example, bottom surface 302 solely or bottom surface 302 along with rib surface 312 may be connected to surface 210 of carrier 208 via seal band 220. The connection of cover 300 to carrier 208 may be such that the cover 300 is also thermally connected to processing device 202. For example, a TIM1 201 may be applied to the top surface of processing device 202 and the underside surface 306 of cover 300 may be thermally connected to the processing device 202 via TIM1 201. Method 500 ends at block 514.

Figure 9:
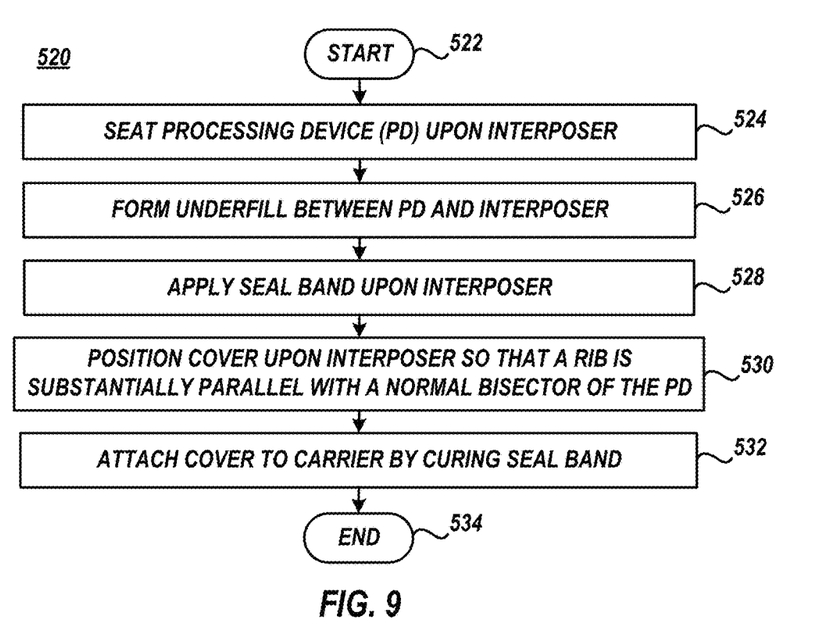

FIG. 9 depicts a method 520 of fabricating an electronic package 200, according to embodiments of the present invention. Method 520 may begin at block 522 and continue with seating the processing device 202 upon the carrier 208 (block 524).

Method 520 may continue with applying underfill 110 material between the processing device 202 and carrier 208 (block 526).

Method 520 may continue with applying seal band 220 material upon surface 210 of carrier 208 (block 528).

Method 520 may continue with positioning cover 300 upon carrier 208 so that one or more lid ribs 310 are at least substantially parallel with a normal bisector 352, 353 of the processing device 202 (block 530). For example, the major length 330 of the one or more ribs 310 may be substantially parallel or parallel with normal bisector 352 or normal bisector 353. Similarly, the "y" axis bisector of rib surface 312 may be substantially parallel or parallel with normal bisector 352 or normal bisector 353. The position of cover 300 upon carrier 208 such that one or more lid ribs 310 are at least substantially parallel with normal bisector 352, 353 of the processing device 202 may also result in the cover 300 being positioned upon seal band 220 material such that the seal band 220 is positioned between bottom surface 302 and/or rib surface 312 and surface 210 of carrier 208. In some embodiments, the cover 300 is further positioned upon the carrier 208 such that inner end surface 318 does or, alternatively, does not touch or contact processing device 202 or underfill 110.

Method 520 may continue with curing the seal band 220 material to securely attach the cover 300 to carrier 208 (block 532). Method 520 ends at block 534

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal," in association with reference to a side view is defined as a plane parallel to the conventional plane or surface of the processing device 202 and/or carrier 208, regardless of the actual spatial orientation of the processing device 202 and/or carrier 208. The term "horizontal," in association with reference to a normal view is defined as a plane perpendicular to the conventional plane or surface of the processing device 202 and/or carrier 208, regardless of the actual spatial orientation of the processing device 202 and/or carrier 208. The term "vertical" refers to a direction perpendicular to the horizontal, as just defined. The term "diagonal" refers to a direction between the vertical and the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A electronic package comprising:
a processing device electrically connected to a carrier, the processing device comprising a diagonal bisector that travels through a center of the processing device and at least one corner of the processing device;
a seal band upon the carrier; and
a cover having a perimeter bottom surface connected to the carrier via the seal band, the cover comprising an underside rib having a major length and minor width, wherein the underside rib is positioned upon the cover such that the major length is parallel with the diagonal bisector and an inner end surface of the underside rib contacts a corner of the processing device, wherein the perimeter bottom surface of the cover and an underside rib surface are coplanar, and wherein the inner end surface is orthogonal to the underside rib surface.

2. The electronic package of claim 1, wherein the underside rib surface and the perimeter bottom surface are integral and coplanar.

3. The electronic package of claim 1, further comprising underfill material between the processing device and the carrier.

4. The electronic package of claim 1, wherein a rib bisector of the underside rib surface is coincident to the diagonal bisector.

5. The electronic package of claim 1, wherein a first side surface of the underside rib is parallel with a second side surface of the underside rib.

6. The electronic package of claim 1, wherein a first side surface of the underside rib is angled against a second side surface of the underside rib.

7. The electronic package of claim 1, wherein an outer end surface of the underside rib faces toward a corner of the cover and is parallel with the inner end surface of the underside rib.

8. The electronic package of claim 7, wherein a first side surface of the underside rib, a second side surface of the underside rib, and the underside rib surface each connect the outer end surface of the underside rib and the inner end surface of the underside rib.

9. A electronic device comprising:
a memory communicatively connected to a processing device;
the processing device electrically connected to a carrier and comprising a diagonal bisector that travels through a center of the processing device and at least one corner of the processing device;

a seal band upon the carrier; and a cover having a perimeter bottom surface connected to the carrier via the seal band, the cover comprising an underside rib having a major length and minor width, wherein the underside rib is positioned upon the cover such that the major length is parallel with the diagonal bisector and an inner end surface of the underside rib contacts a corner of the processing device, wherein the perimeter bottom surface of the cover and an underside rib surface are coplanar, and wherein the inner end surface is orthogonal to the underside rib surface.

10. The electronic device of claim 9, wherein the underside rib surface and the perimeter bottom surface are integral and coplanar.

11. The electronic package of claim 9, further comprising underfill material between the processing device and the carrier.

12. The electronic package of claim 9, wherein a rib bisector of the underside rib surface is coincident to the diagonal bisector.

13. The electronic package of claim 9, wherein a first side surface of the underside rib is parallel with a second side surface of the underside rib.

14. The electronic package of claim 9, wherein a first side surface of the underside rib is angled against a second side surface of the underside rib.

15. The electronic package of claim 9, wherein an outer end surface of the underside rib faces toward a corner of the cover and is parallel with the inner end surface of the underside rib.

16. The electronic package of claim 15, wherein a first side surface of the underside rib, a second side surface of the underside rib, and the underside rib surface each connect the outer end surface of the underside rib and the inner end surface of the underside rib.

* * * * *